US006989545B1

(12) United States Patent
Rathmell et al.

(10) Patent No.: US 6,989,545 B1
(45) Date of Patent: Jan. 24, 2006

(54) DEVICE AND METHOD FOR MEASUREMENT OF BEAM ANGLE AND DIVERGENCE

(75) Inventors: Robert D. Rathmell, Murphy, TX (US); Douglas A. Brown, Peabody, MA (US); Andrew M. Ray, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/886,308

(22) Filed: Jul. 7, 2004

(51) Int. Cl.
*H01J 37/317* (2006.01)
(52) U.S. Cl. .............. 250/492.21; 250/397; 250/398; 250/492.1; 250/492.2; 250/492.3
(58) Field of Classification Search ................ 250/397, 250/398, 492.1, 492.2, 492.21, 492.3
See application file for complete search history.

(56) References Cited

U.S. PATENT DOCUMENTS

| 4,468,565 | A | * | 8/1984 | Blair et al. .............. 250/491.1 |
|---|---|---|---|---|
| 4,574,179 | A | * | 3/1986 | Masuzawa et al. ..... 219/121.43 |
| 5,120,968 | A | * | 6/1992 | Fiorito et al. ................ 250/397 |
| 5,661,304 | A | * | 8/1997 | Kimura et al. ............... 250/397 |
| 6,194,732 | B1 | * | 2/2001 | Okino ....................... 250/491.1 |
| 6,313,910 | B1 | * | 11/2001 | Garvey et al. ............... 356/121 |
| 6,677,598 | B1 | * | 1/2004 | Benveniste ............ 250/492.21 |
| 6,690,022 | B2 | * | 2/2004 | Larsen et al. .......... 250/492.21 |
| 6,852,984 | B2 | * | 2/2005 | Krueger ....................... 250/397 |
| 6,872,953 | B1 | * | 3/2005 | Benveniste .................. 250/397 |
| 6,891,174 | B2 | * | 5/2005 | Wenzel et al. ......... 250/492.21 |
| 2002/0121613 | A1 | | 9/2002 | Scheuer et al. |
| 2002/0121889 | A1 | | 9/2002 | Larsen et al. |
| 2004/0149926 | A1 | * | 8/2004 | Purser et al. ................ 250/397 |
| 2004/0262532 | A1 | * | 12/2004 | Krueger ....................... 250/397 |
| 2004/0262533 | A1 | * | 12/2004 | Krueger ....................... 250/397 |

OTHER PUBLICATIONS

"In-Situ Ion Beam Profiling by Fast Scan Sampling", P. Splinter, F. Sinclair, N. Demario, W. Reed, J. Castantini, D. Shen, J. Burgess, P. Ring and S. Hirokawa, IEEE, 1997, pp. 272-275.

"Measurement of the Four-Dimensional Transverse Emittance of an Ion Beam", Issam Zeinoun, Victor Benveniste, Kourosh Saadatmand and David Swenson, American Institute of Physics, Review of Scientific Instruments, vol. 71, No. 2, Feb. 2000, pp. 1194-1196.

"Beam Parallelism in the 8250 Medium Current Implanter", Robert D. Rathmell, Dennis E. Kamenitsa, Monty L. King and Andrew M. Ray; IIT, 1998, 4 pgs.

"Scanned Beam Uniformity Control in the VIISta 810 Ion Implanter", J. C. Olson, A. Renau and J. Buff, IEEE, 1999, pp. 169-172.

(Continued)

*Primary Examiner*—John R. Lee
*Assistant Examiner*—Bernard E. Souw
(74) *Attorney, Agent, or Firm*—Eschweiler & Associates, LLC

(57) ABSTRACT

The present invention facilitates semiconductor device fabrication by obtaining angle of incidence values and divergence of an ion beam normal to a plane of a scanned beam. A divergence detector comprising a mask and profiler/sensor is employed to obtain beamlets from the incoming ion beam and then to measure beam current at a number of vertical positions. These beam current measurements are then employed to provide the vertical angle of incidence values, which provide a vertical divergence profile that serves to characterize the ion beam. These values can be employed by an ion beam generation mechanism to perform adjustments on the generated ion beam or position of the workpiece if the values indicate deviation from desired values.

25 Claims, 10 Drawing Sheets

OTHER PUBLICATIONS

"Sweep Uniformity Control system in the NISSIN NH-20SP", N. Nagai, K. Nishikawa and H. Kumazaki, Ion Implantation Technology, 1992, 4 pgs.

Overview of the Eaton NV-8200P High Beam Purity, Parallel Scanning Implanter:, Andrew M. Ray, Jerald P. Dykstra and Robert B. Simonton, Ion Implantation Technology, 1992, pp. 401-404.

"Beam Angle Control on the VIISta 80 Ion Implanter", Christopher Campbell, James Cummings, Robert Lindberg, Joseph C. Olson, Svetlana B. Radovanov and Donna L. Smatlak, Ion Implantation Technology, 2002, 4 pgs.

* cited by examiner

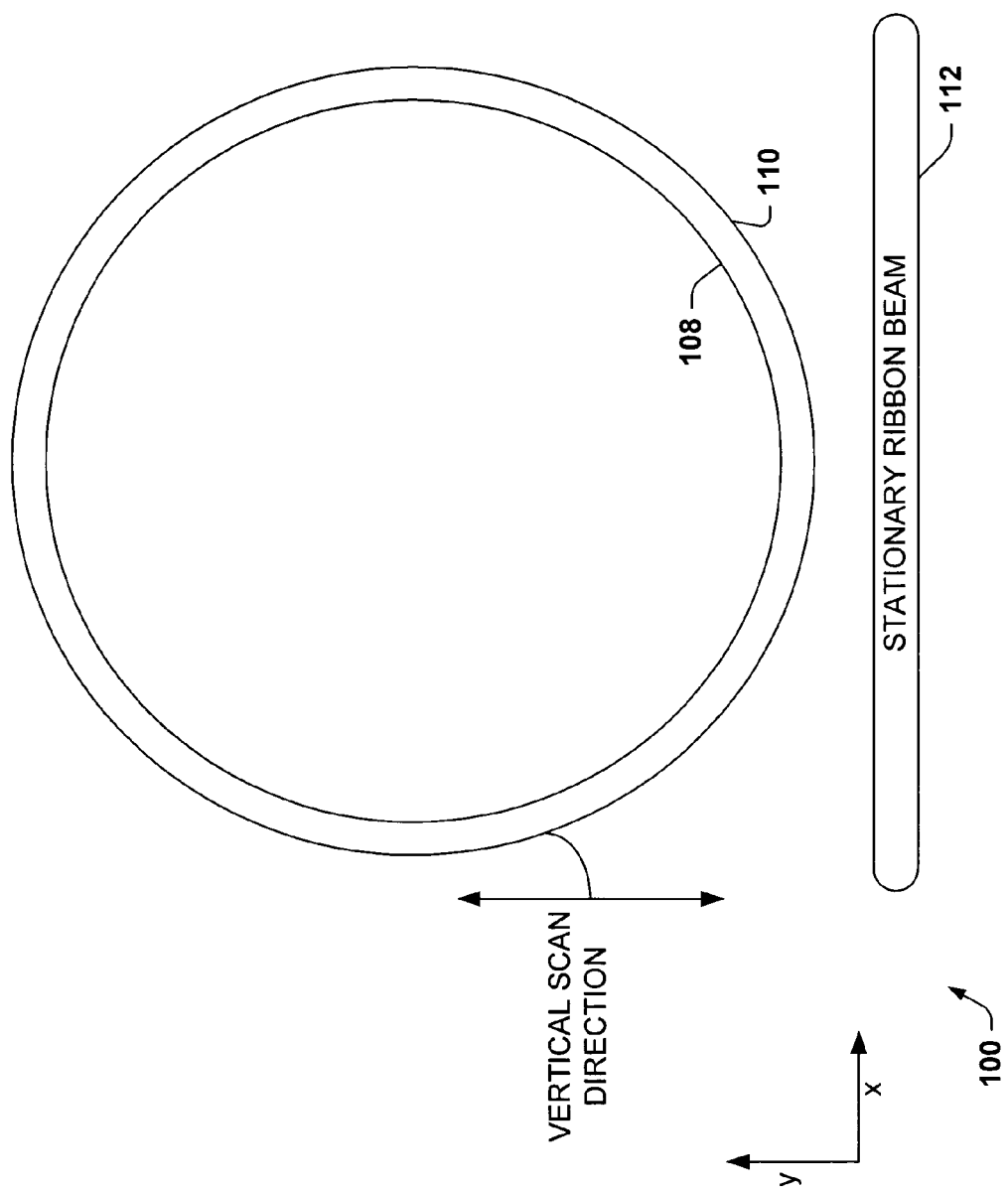

DEVICE AND METHOD FOR MEASUREMENT OF BEAM ANGLE AND DIVERGENCE

FIELD OF INVENTION

The present invention relates generally to ion implantation devices, and, more particularly, to measurement of ion beam angle of incidence values and divergence.

BACKGROUND OF THE INVENTION

Ion implantation is a physical process, as opposed to diffusion, which is a chemical process, employed in semiconductor device fabrication to selectively implant dopant into semiconductor and/or wafer material. Thus, the act of implanting does not rely on a chemical interaction between a dopant and the semiconductor material. For ion implantation, dopant atoms/molecules are ionized and isolated, sometimes accelerated or decelerated, formed into a beam, and swept across a wafer. The dopant ions physically bombard the wafer, enter the surface and come to rest below the surface.

An ion implantation system is a collection of sophisticated subsystems, each performing a specific action on the dopant ions. Dopant elements, in gas or solid form, which is then vaporized, are positioned inside an ionization chamber and ionized by a suitable ionization process. In one exemplary process, the chamber is maintained at a low pressure (vacuum). A filament is located within the chamber and is heated to the point where electrons are created from the filament source. The negatively charged electrons are attracted to an oppositely charged anode also within the chamber. During the travel from the filament to the anode, the electrons collide with the dopant source elements (e.g., molecules or atoms) and create a host of positively charged ions from the elements in the molecule.

Generally, other positive ions are created in addition to desired dopant ions. The desired dopant ions are selected from the ions by a process referred to as analyzing, mass analyzing, selection, or ion separation. Selection is accomplished utilizing a mass analyzer that creates a magnetic field through which ions from the ionization chamber travel. The ions leave the ionization chamber at relatively high speeds and are bent into an arc by the magnetic field. The radius of the arc is dictated by the mass of individual ions, speed, and the strength of the magnetic field. An exit of the analyzer permits only one species of ions, the desired dopant ions, to exit the mass analyzer.

Subsequently, the desired ions may be transported through ion optical elements that have the purpose of focusing the ions, or affecting the trajectories of the ions to make their angles match the needs of the implant, or changing the ion energies, or deflecting the ions to cover a workpiece of a relatively large size, or all of these effects in combination.

Continuing on, the dopant ions are then directed towards a target wafer at an end station. The dopant ions, as a beam, impact the wafer with a beam intensity, which is a measure of the number of particles per unit time as a function of position, and emittance, which is an angular distribution (angle of incidence) of the beam as a function of position. Generally, it is desirable that the beam intensity and emittance be substantially uniform and at expected or desired values.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by obtaining angle of incidence values and divergence of an ion beam normal to a plane of a scanned beam. The vertical angle of incidence values provide a vertical divergence profile that serves to characterize the ion beam. These values can be employed by an ion beam generation mechanism to perform adjustments on the generated ion beam or the angle of the workpiece if the values indicate deviation from desired values.

In one aspect of the invention, a divergence detector includes a mask and a vertically traveling profiler. The mask has a single column of rectangular shaped openings or apertures, longer in a horizontal direction, that obtain beamlets from an incoming ion beam. The vertically traveling profiler is located a selected distance downstream of the mask and measures beam current from the obtained beamlets as the profiler travels. Vertical positional information is obtained from the beam current that is employed to derive vertical angle of incidence values of the obtained beamlets. The vertical angle of incidence values serve to characterize the "tilt" angle of implant for the ion beam.

In another aspect of the invention, a divergence detector includes a mask and a multi-fingered profiler. The mask has an array of openings or apertures that obtain beamlets from an incoming ion beam. The multi-fingered profiler is located a selected distance downstream of the mask and has a number of fingers along a vertical direction that can simultaneously measure current from the beamlets. The current measurements are employed to obtain vertical position information, which is then employed to determine vertical angle of incidence values at a particular horizontal location. The multi-fingered profiler can be moved, continuously or periodically, in a horizontal direction to obtain vertical angle of incidence values at other horizontal locations.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1C is another ion beam view of the serial wafer ion implantation system in accordance with an aspect of the present invention.

DETAILED DESCRIPTION OF THE INVENTION

Figure 1A:
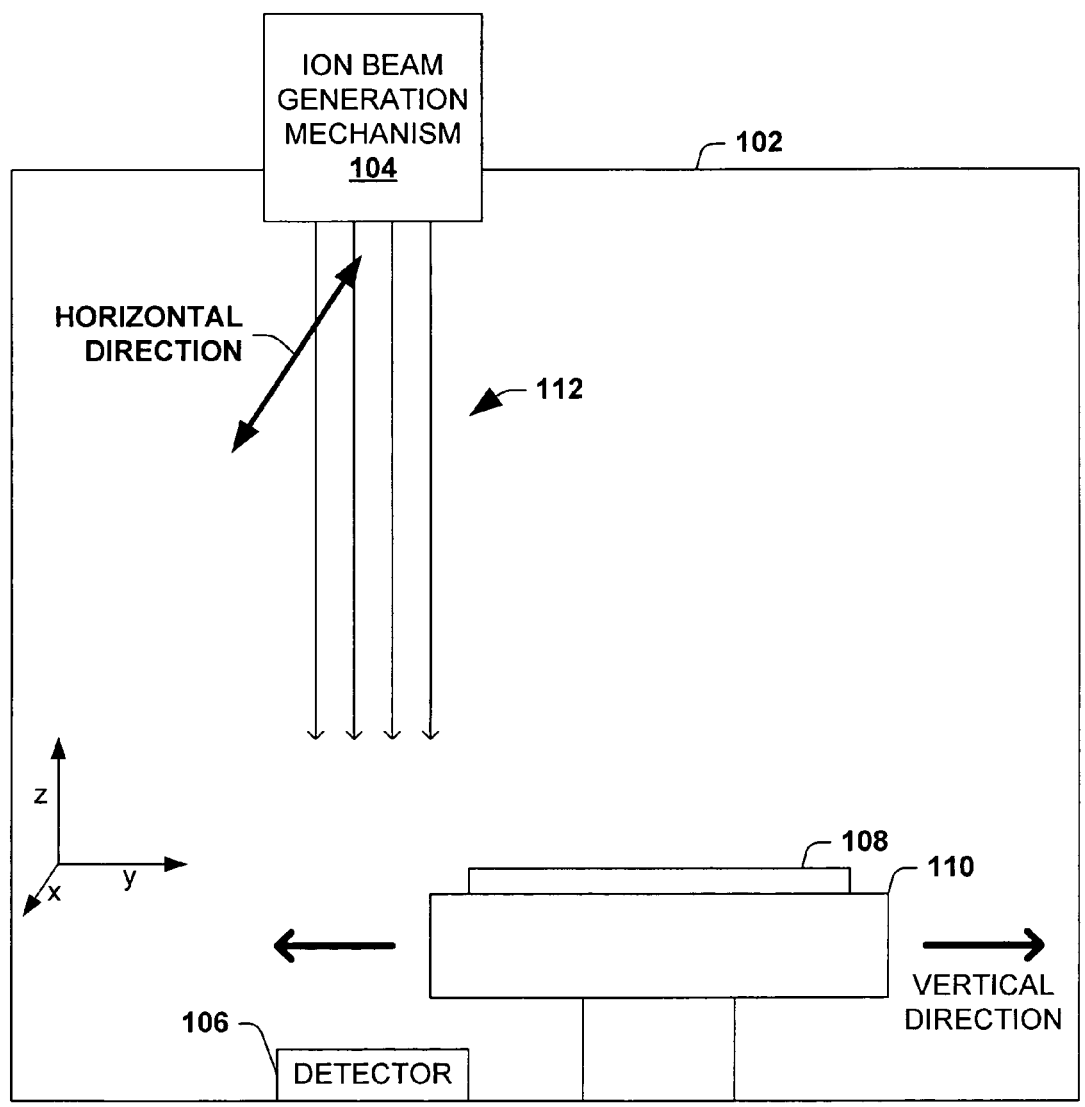
FIG. 1A is a side view of a serial wafer ion implantation system in accordance with an aspect of the present invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

Ion beam profile and angular content are significant in determining the uniformity of ion implantation and performing adjustments to increase uniformity during ion implantation processes. One characteristic of uniformity is ion beam intensity, which is a measure of the number of particles per unit time at a given location of an ion beam cross section. Another characteristic of uniformity is ion beam divergence, which is the angular distribution of the beam as a function of position within the beam. Divergence of an ion beam, in vertical dimensions, is employed to characterize the "tilt" angle of an implant, which is defined as an angle between the normal to a target wafer and a plane of a scanned or ribbon beam. Divergence is the angle of some part of the beam relative to its axis of symmetry.

In certain classes of ion implanters (e.g., serial ion implanters), the target wafer remains stationary in one plane and the ion beam is scanned across the wafer surface. Other classes of ion implanters, referred to as batch ion implanters, employ a spinning disk or platen on which are affixed a number of wafers that are rotated through an incident ion beam.

Ion beam profile and angular content are important in determining the uniformity result of ion implantations, particularly in serial implanters where different parts of a target wafer are implanted by different parts of a beam. It may be necessary to manipulate angular content and profile prior to ion implantation in order to obtain a substantially uniform implant across a target wafer.

The present invention facilitates semiconductor device fabrication by measuring angle of incidence values in at least a vertical direction. So doing permits adjustments to be made to the generation and/or delivery of the ion beam. The adjustments can be employed to improve uniformity of the ion beam as well as to alter the "tilt" angle to a more desirable value.

Figure 1B:
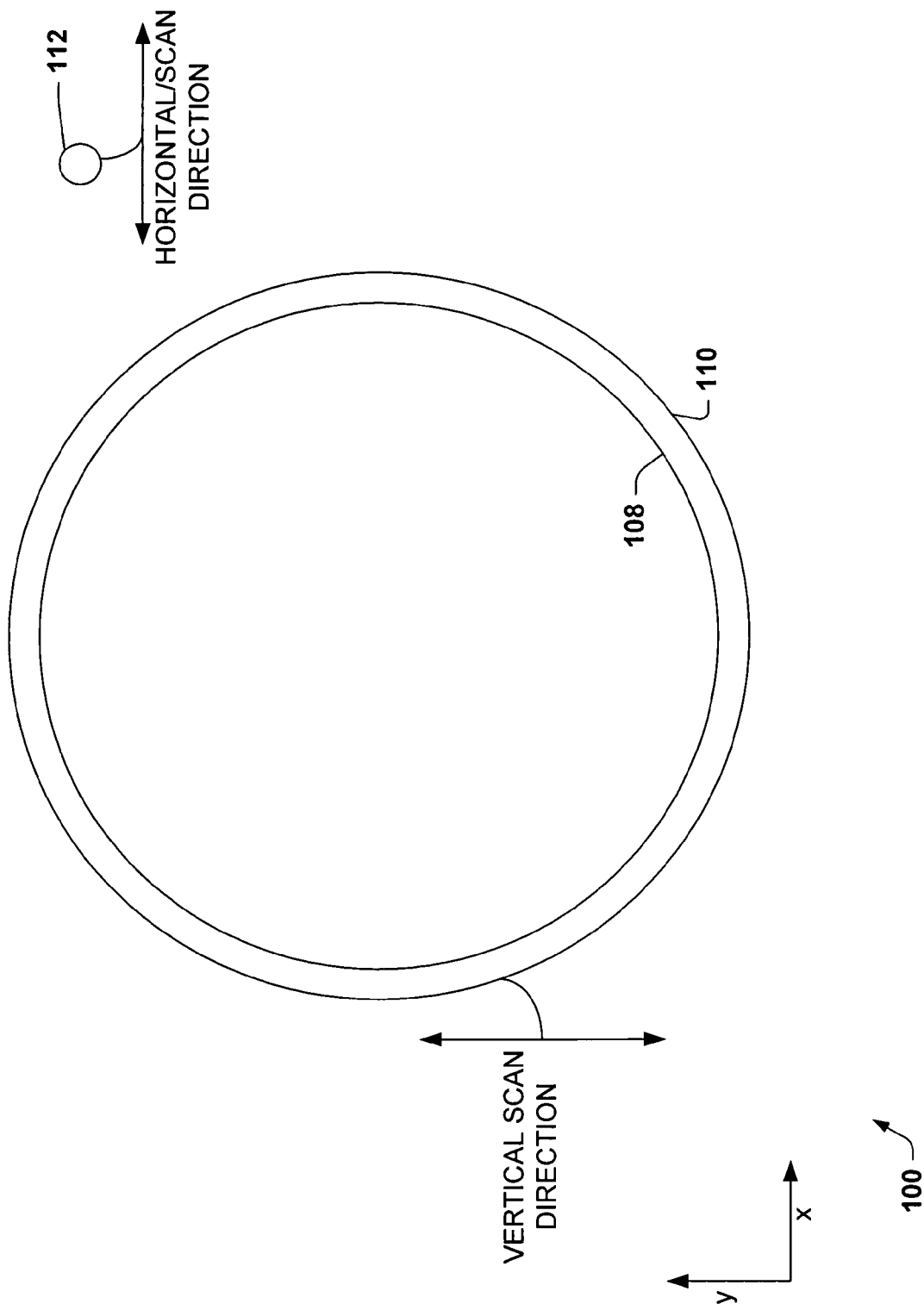
FIG. 1B is an ion beam view of the serial wafer ion implantation system in accordance with an aspect of the present invention.

FIGS. 1A and 1B illustrate a serial wafer ion implantation system in accordance with an aspect of the present invention. The system is operative to characterize an ion beam with respect to vertical angle of incidence values and perform adjustments there from. Beginning with FIG. 1A, a side view of a serial wafer ion implantation system 100 in accordance with an aspect of the present invention is illustrated. The system 100 includes a chamber 102, an ion beam generation mechanism 104 including an ion source, a divergence detector 106, and a module 110, also referred to as a pedestal or end station, that holds a single wafer 108. The system 100 depicted in FIG. 1 is provided for illustrative purposes and is not intended to include all aspects, components, and features of an ion implantation system. Instead, the system 100 is depicted so as to facilitate a further understanding of the present invention.

The ion beam generation mechanism 104 generates an ion beam 112, typically a ribbon beam or scanned pencil beam, having a number of characteristics including, shape, dopant type, dose, beam current, intensity, emittance, angle of incidence, energy, and the like. The ion beam generation mechanism 104 includes typical components such as, an ion source/chamber, a mass analyzer to select desired dopant ions, an acceleration system to accelerate or decelerate the desired dopant ions to a predetermined momentum, and focusing lenses or mechanism to control and/or mitigate divergence of the ion beam. If the ion beam 112 is a pencil beam, the ion beam 112 is moved/scanned in a horizontal direction as shown in FIG. 1A. Although the ion beam 112 is depicted as being substantially orthogonal to a surface of the wafer 108, the ion beam 112 can be at other incident angles with the surface of the wafer 108 (e.g., θ>0, where 0 is a beam perpendicular to the surface).

As stated above, the module 110 holds the wafer 108, for example, via a mechanical or electrostatic clamp and is located downstream of the ion beam 112. Additionally, the module 110 is operable to move the wafer (as indicated) through the ion beam 112 at a controlled rate so as to achieve desired implantation results. In an alternate aspect, the ion beam 112 is moved across the wafer in a single pass or multiple passes. Generally, a given ion implantation is performed in a single pass of the wafer 108 through the ion beam 112. By so doing, a substantially uniform implantation across the wafer 108 can be obtained because all parts or portions of the wafer 108 move through the ion beam 112 at about the same rate. In contrast, other ion implantation systems employ a process disk that may also incorporate the present invention.

The divergence detector 106 in the present example is positioned below the module 110 and in-line with the ion beam 112. The detector 106 is shown in a stationary position. It is appreciated that alternate aspects of the invention include any suitable number of detectors, detectors located at other positions, and movable detectors. For example, the detector 106 may be integrated on to the module or pedestal 110 and be in substantially the same plane as the wafer 108.

The divergence detector 106 measures angles of incidence and divergence of the ion beam in a plane normal to the plane of the ion beam 112 (scanned or ribbon), also referred to as a vertical direction and illustrated in FIG. 1A. The divergence detector 106 can, in alternate aspects of the invention, measure angles of incidence and divergence of the ion beam in a plane parallel to the plane of the ion beam 112, also referred to as a horizontal direction.

The divergence detector 106 comprises a mask (not shown in FIGS. 1A, 1B, and 1C) with holes and/or apertures and a sensor (not shown in FIGS. 1A, 1B, and 1C) such that the mask extracts or passes beamlets from the ion beam that are then measured by the sensor at various vertical locations to determine angle of incidence values and divergence for at least the vertical direction. The sensor typically measures beam current for the beamlets at the various vertical locations and compares the location where beam current is measured to where it is expected to be measured to identify angle of incidence offsets or variations from a desired angle of incidence. The measured beam current can also be employed by the detector 106 to derive beam intensity and beam shape, in order to more completely characterize the ion beam 112.

The measurements obtained by the divergence detector 106 can be employed by the ion beam generation mechanism 104 and/or the wafer holding module 110 to modify the generated ion beam 112 and/or to compensate for undesired deviations in angle of incidence and/or divergence.

FIG. 1B is a ion beam view of the serial wafer ion implantation system 100 in accordance with an aspect of the present invention. This view serves to further illustrate the ion beam in relation to the horizontal and vertical scan directions.

The single wafer 108 is shown on the module 110 (pedestal or end station). The module 110, and thereby the single wafer 108, is mechanically moved in a vertical scan direction (y direction) as indicated in FIG. 1B. The ion beam 112 is depicted as a pencil beam in this view. The ion beam 112 is scanned or moved across the single wafer 108 in a horizontal/scan direction (x direction) as indicated. The divergence detector 106 obtains angle of incidence measurements for at least the vertical direction at a plurality of positions and thereby determines divergence of the ion beam 112 along at least the vertical scan direction.

FIG. 1C is an ion beam view of the serial wafer ion implantation system 100 in accordance with an aspect of the present invention. This view serves to further illustrate the ion beam in relation to the horizontal and vertical scan directions wherein the ion beam 112 is a ribbon beam.

The single wafer 108 is shown on the module 110 (pedestal or end station). The module 110, and thereby the single wafer 108, is mechanically moved in a vertical scan direction (y direction) as indicated in FIG. 1B. The ion beam 112 is depicted as a ribbon beam that covers the single wafer 108 when the module/pedestal moves the wafer 108 through the ribbon beam in the vertical direction. The divergence detector 106 obtains angle of incidence measurements for at least the vertical direction at a plurality of positions and thereby determines divergence of the ion beam 112 along at least the vertical scan direction.

Figure 2:
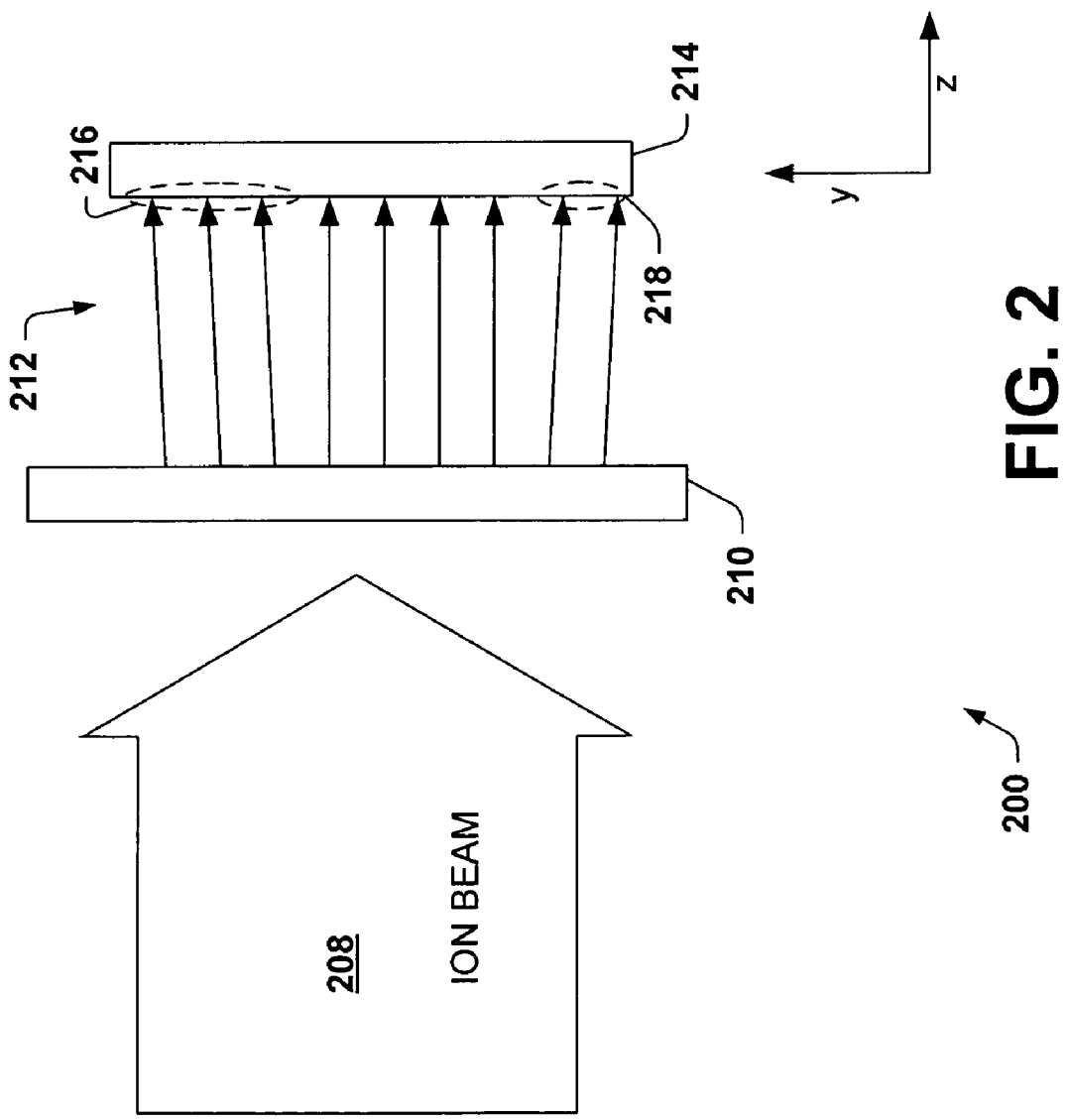
FIG. 2 is a side view of a divergence monitoring system in accordance with an aspect of the present invention.

FIG. 2 is a side view of a divergence monitoring system 200 in accordance with an aspect of the present invention. The system 200 monitors divergence of an incoming ion beam 208 (traveling in a z direction) in at least a vertical direction (y direction). The vertical direction is normal to the scanning direction of the ion beam 208.

The system 200 includes a mask 210 and a profile sensor 214. The mask 210 has a number of apertures that selectively extract a number of beamlets 212 from the ion beam 208. The apertures, in one example, include rectangular shaped openings and/or rows of smaller circular shaped openings. The shape and size of the apertures is at least partially dependent on the type of sensor employed as the profile sensor 214. Further description of the apertures, including suitable shapes and sizes, are provided infra.

The profile sensor 214 obtains beam current measurements for the beamlets 212 at a number of locations or positions. From these beam current measurements, angle of incident values/measurements can be determined in the vertical direction at the number of positions. Typically, the profile sensor 214 includes circuitry to perform the determination or a separate control system obtains the beam current measurements and performs the determination. The angle of incidence values provide a profile of divergence for the incoming ion beam 208 in the vertical scan direction (y direction).

For illustrative purposes, the ion beam 208 is depicted as being normal to the mask 210 and the sensor 214. Locations 216 and 218 illustrate angle of incidence values that are offset by an angle from desired values or from an axis of symmetry of the beam. The obtained profile of divergence can then be employed to calculate the effective or average angle for the distribution of ions 212.

Figure 3A:
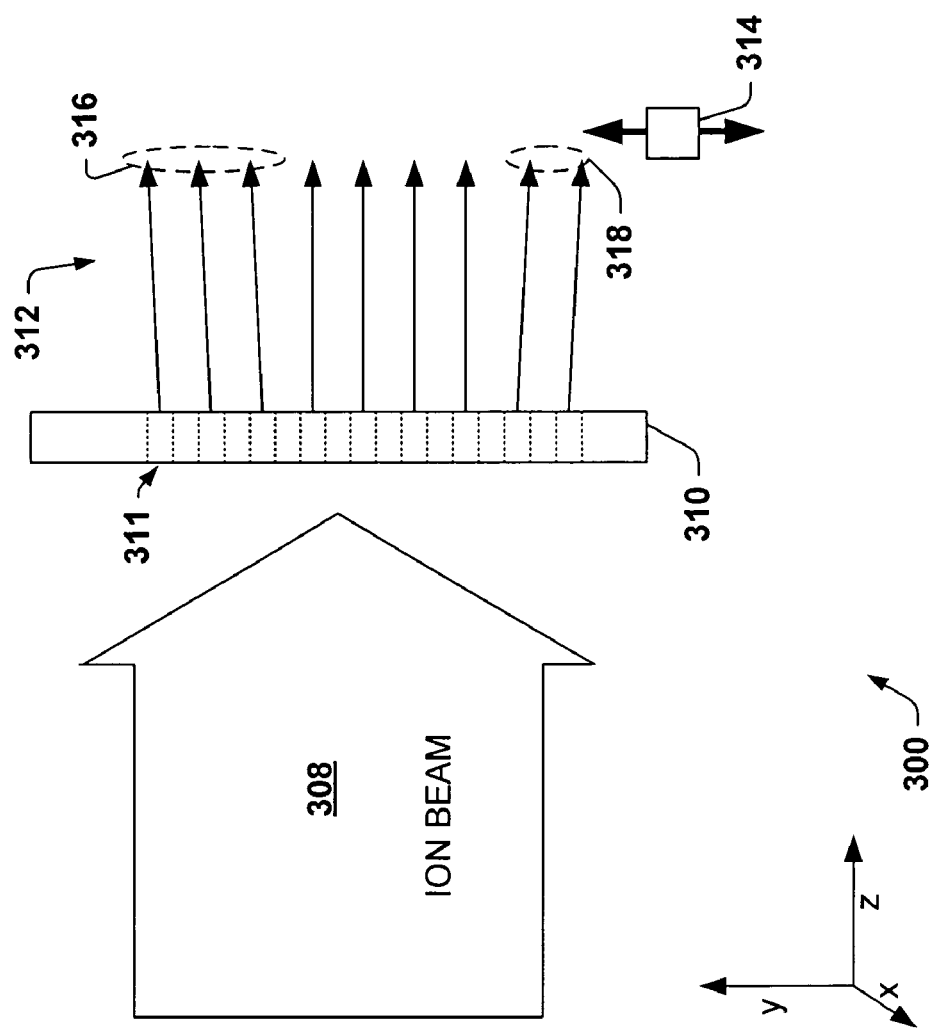
FIG. 3A is a side view of a divergence monitoring system in accordance with an aspect of the present invention.
Figure 3B:
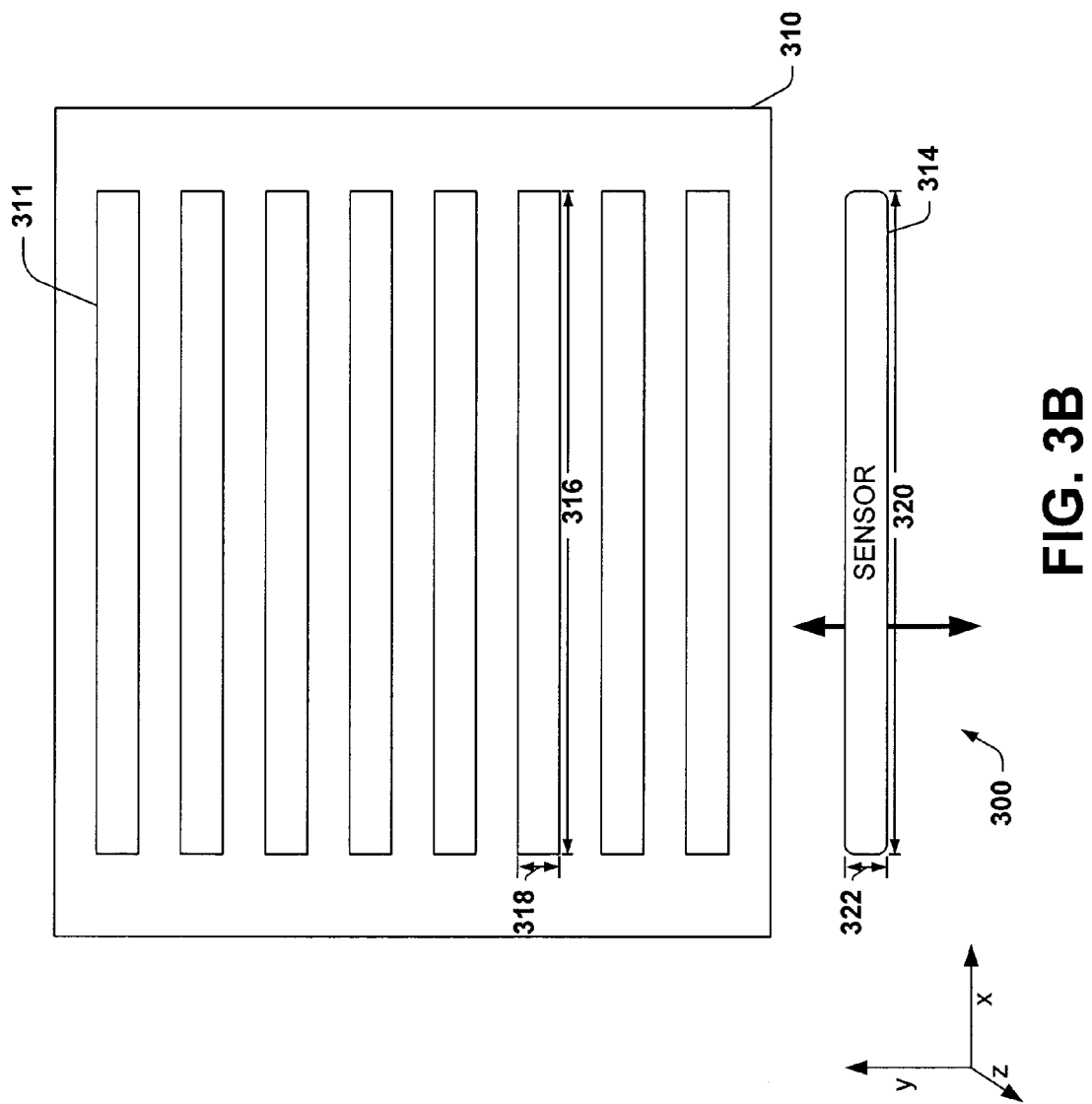
FIG. 3B is an ion beam view of the divergence monitoring system in accordance with an aspect of the present invention.

FIGS. 3A and 3B are views illustrating a more detailed divergence monitoring system in accordance with an aspect of the present invention. FIG. 3A is a side view of a divergence monitoring system 300 in accordance with an aspect of the present invention. The system 300 employs a vertically traveling profiler/sensor 314 to measure angles of incidence in a vertical plane of an incident ion beam 308 traveling in a z direction. The system 300 can also include an additional profiler (not shown) to measure angles of incidence in a horizontal direction.

The system 300 includes a mask 310, which has a number of apertures 311 that permit a number of beamlets 312 to pass through the mask 310. The profiler 314 travels vertically as indicated in FIG. 3A and encounters the beamlets as it travels at locations referred to as sensor locations, wherein the profiler measures beam current of the beamlets at the sensor locations.

The sensor 314 is positioned a selected distance in the z direction from the mask 310 so that the beamlets 311 travel the selected distance and arrive at the sensor locations, which are dependent on the selected distance and vertical angle of incidence values. Generally, the beamlets should arrive at expected sensor locations, however deviations or offsets from desired angle of incidence values result in associated beamlets arriving at sensor locations that are offset from the expected sensor locations. The location offsets and the selected distance are employed to determine angle of incidence offset values (e.g., approximately the location offset divided by the selected distance). The angle of incidence offset values can be added to desired angle of incidence values to determine measured angle of incidence values.

In FIG. 3A, as an example, some of the beamlets arrive at locations 316 which are offset from expected locations by positive values on the y axis. As a result, the associated beamlets have angle of incidence offset values that are positive. Others of the beamlets arrive at locations 318, which are offset from expected locations by negative values on the y axis. As a result, the beamlets arriving at locations 318 have angle of incidence offset values that are negative.

FIG. 3B is an ion beam view of the divergence monitoring system 300 in accordance with an aspect of the present invention. This view further illustrates the mask 310 and the traveling vertical profiler 314.

The profiler 314 has a width 322 in the y direction and a length 320 in the x direction. The length 320 is typically larger than the width 322. The profiler 314 generally moves in the y or vertical direction, whereas the ion beam 308 moves/scans in the x or horizontal direction.

The mask 310 includes a number of rectangular shaped apertures 311 that are longer in the horizontal direction than the vertical direction. The apertures have a width 318 in the y or vertical direction and a length 316 in the x or horizontal direction.

Figure 4A:
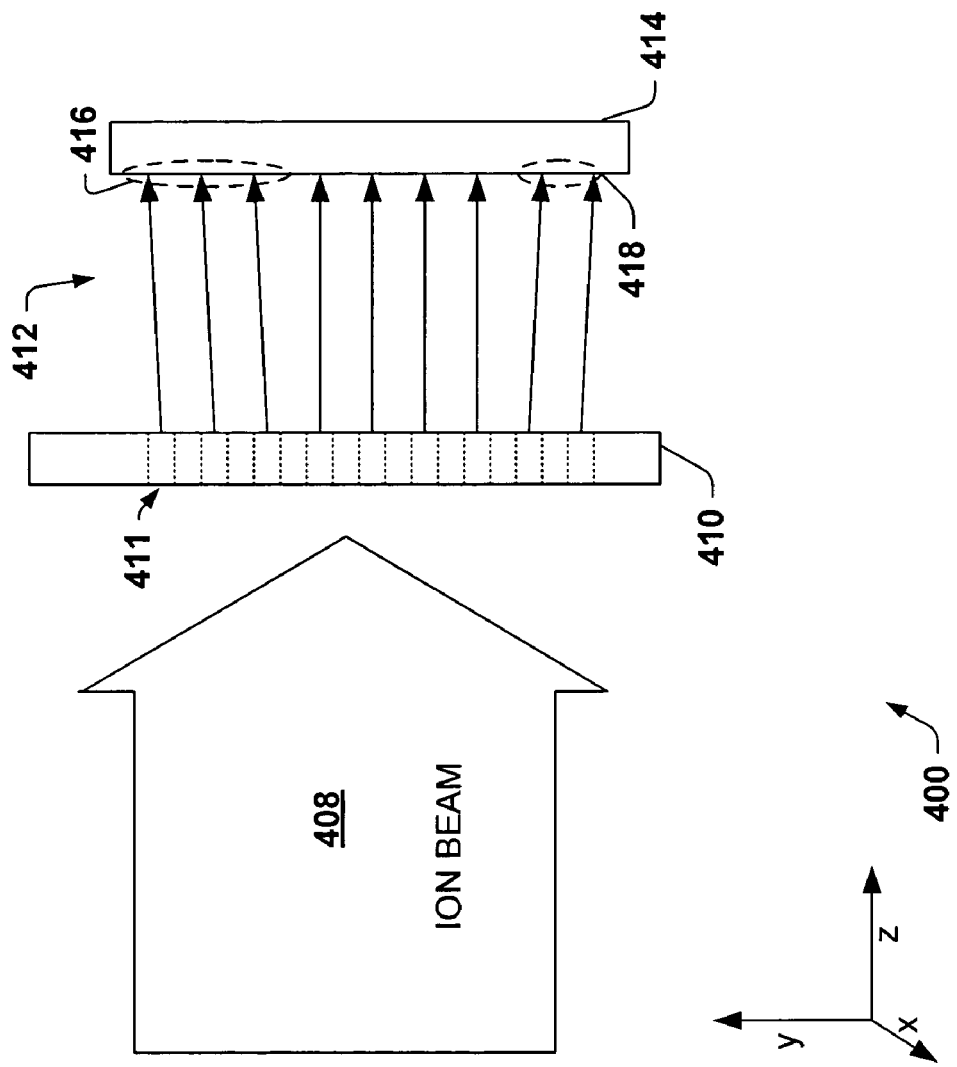
FIG. 4A is a side view of a divergence monitoring system in accordance with an aspect of the present invention.
Figure 4B:
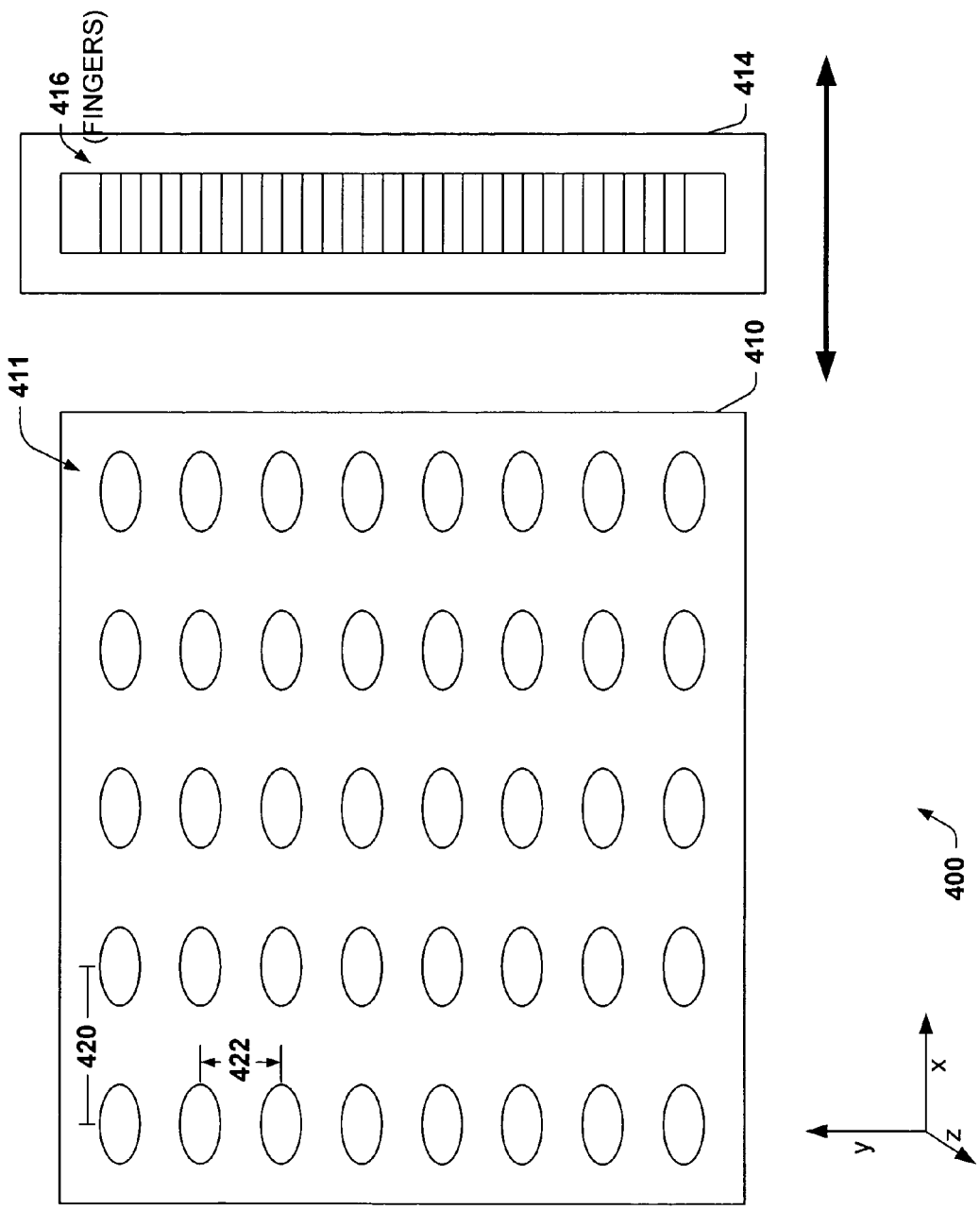
FIG. 4B is an ion beam view further illustrating the monitoring system in accordance with an aspect of the present invention.

FIGS. 4A and 4B are views illustrating another divergence monitoring system in accordance with an aspect of the present invention. FIG. 4A is a side view of a divergence monitoring system 400 in accordance with an aspect of the present invention. The system 400 obtains vertical angle of incidence values at a number of horizontal positions.

The system 400 includes a mask 410 and a multi-fingered profiler/sensor 414, wherein the mask 410 is spaced a selected distance in front of the mult-fingered profiler 414. The mask 410 includes an array of holes or apertures 411 that selectively obtain beamlets 412 from an incoming ion beam 408. The multi-fingered profiler 414 moves in a horizontal direction and includes a number of finger sensors (e.g., 64) that are operable to measure beam current. The mutli-fingered profiler 414 analyzes which finger sensors measure beam current and obtains vertical angle of incidence values at one or more horizontal positions there from. Vertical angle of incidence values are then determined according to where finger sensors detected beam current compared with where finger sensors were expected to detect beam current. A multiplexer circuit present within the multi-fingered profiler can provide beam current measurements from the finger sensors as a serial and/or parallel data stream.

As an example, FIG. 4A depicts erroneous angle of incidence values at regions 416 and 418. In the region 416, beam current is detected at finger sensors above where beam current should have been detected. In the region 418, beam current is detected at finger sensors below where beam current should have been detected.

Turning now to FIG. 4B, an ion beam view further illustrating the monitoring system 400 in accordance with an aspect of the present invention is provided. This view further illustrates the mask 410 and the multi-fingered profiler 414. The mask is shown with an array of apertures 411, which are illustrated with oval shapes. However, it is appreciated that the apertures 411 can have circular and/or rectangular shapes and other suitable sizes in accordance with the present invention. FIG. 4B depicts an array of apertures 411 having 5 columns and 8 rows, however the present invention is not limited to a particular number of columns and/or rows. Spacing between columns is at a selected horizontal distance 420 and spacing between rows is at a selected vertical distance 422. It is appreciated that the present invention contemplates a variety of suitable array arrangements and dimensions. Multiple columns present in the array of apertures 411 permit measurement of vertical angle of incidence values at multiple locations along the x axis (horizontal direction).

The multi-fingered profiler 414 has a number of fingers 416, as described above. The fingers 416 are a number of closely spaced collectors that measure beam current of beamlets that pass through apertures 411. There are enough fingers to provide sufficient resolution to measure a shape and position of each beamlet with a small number of fingers (e.g., 5 or more). The measurements obtained from the small number of fingers are employed by circuitry within the multi-fingered profiler to determine a centroid each beamlet from associated sets of measuring fingers. The determined centroids are then employed by the circuitry to obtain offset positional information and offset vertical angle of incidence values relative to a desired or ideal beam axis. For each column of the array of apertures, associated offset angle of incidence values provide a measure of vertical divergence of the ion beam 408 at a particular horizontal location. The profiler circuitry is operable to determine a flux weighted average of the vertical angles of incidence relative to the intended, desired axis, which can then be employed by other components in an ion implantation system to improve the flux weighted average of vertical angles of incidence (e.g., by adjusting mechanical tilt of a pedestal holding a wafer). It is appreciated that the determination of the flux weighted average can be included in other aspects of the invention (e.g., FIGS. 2 and 3).

Figure 5:
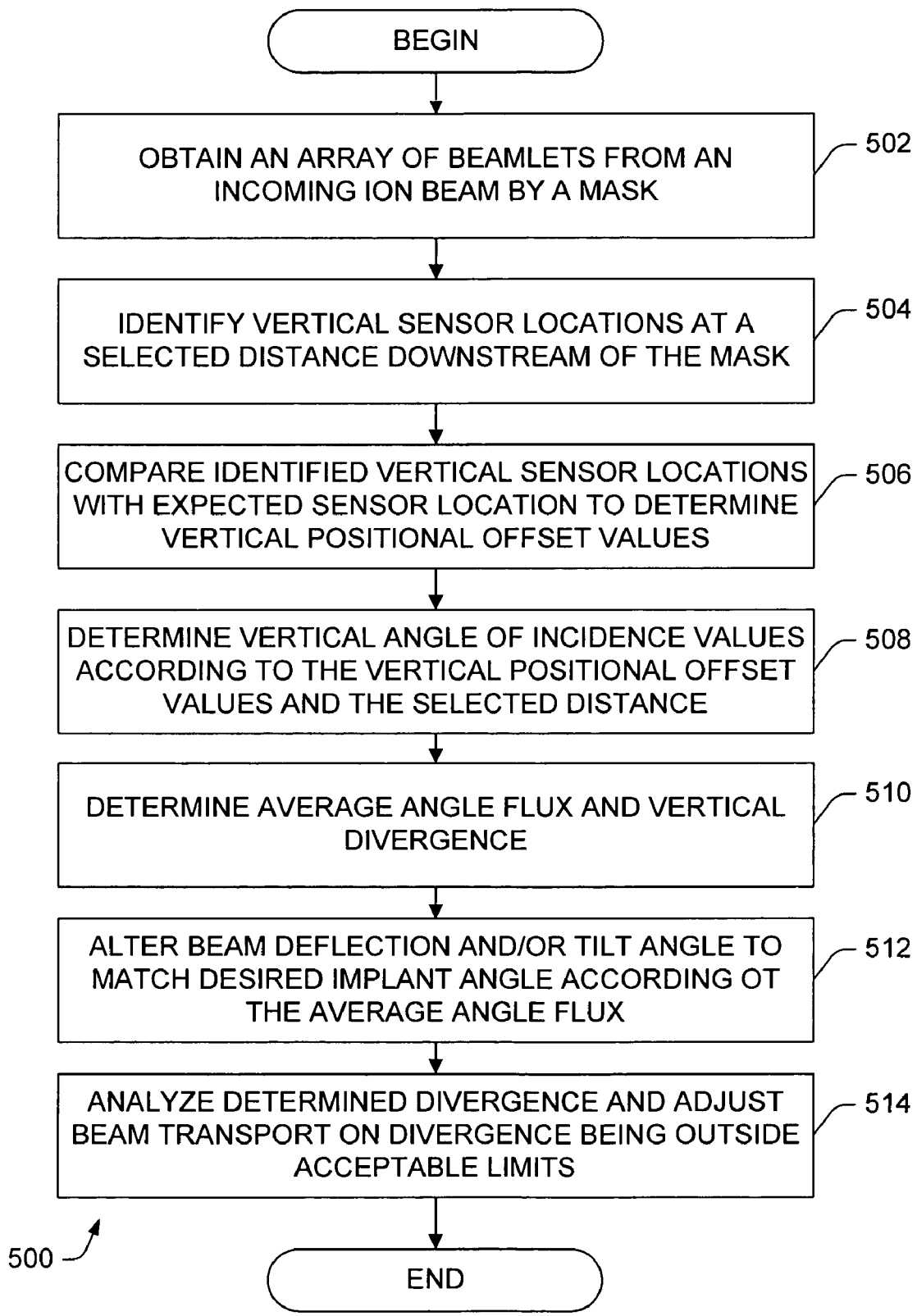
FIG. 5 is a flow diagram illustrating a method of obtaining vertical angle of incidence values in accordance with an aspect of the present invention.
Figure 6:
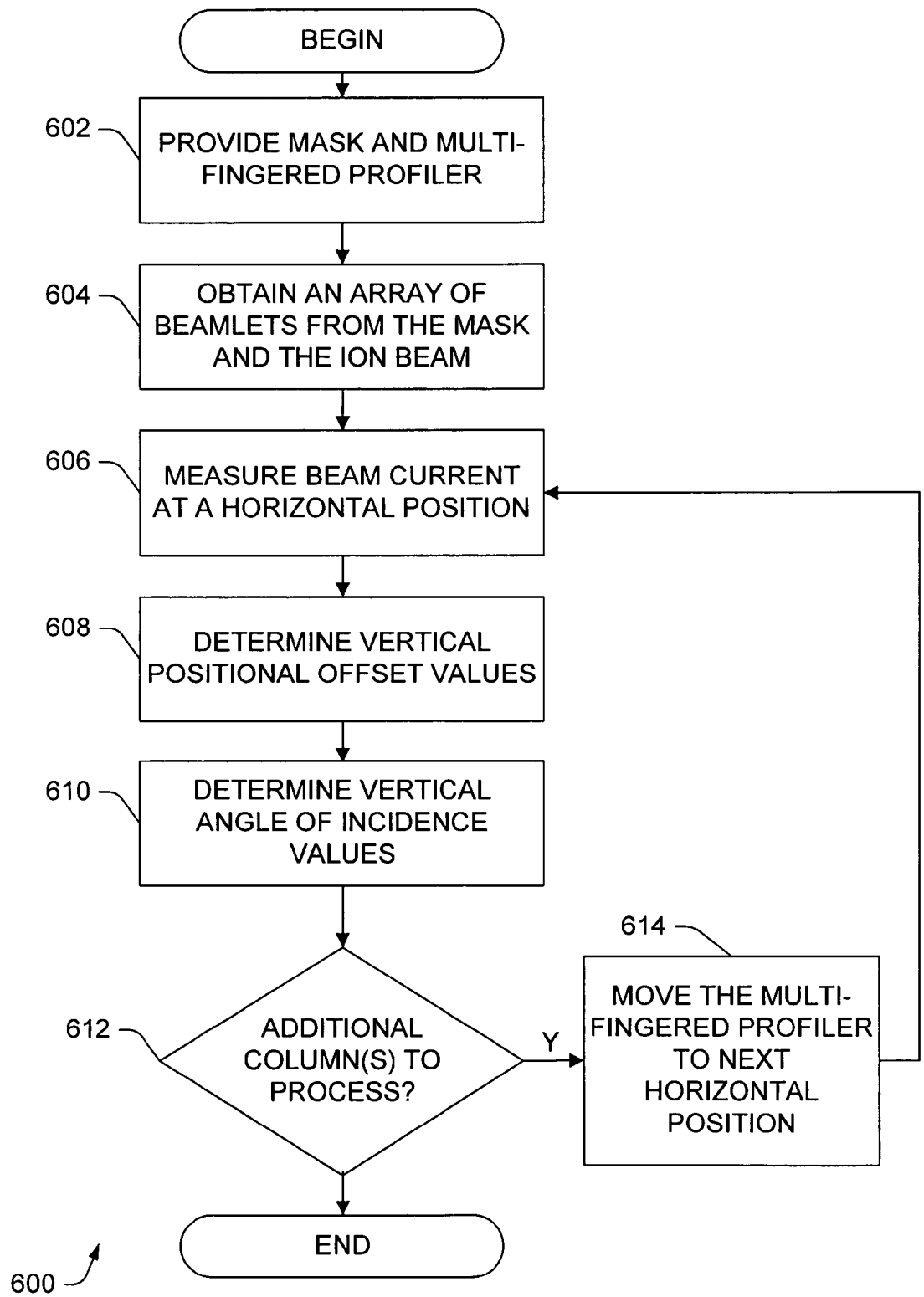
FIG. 6 is a flow diagram illustrating a method of obtaining vertical angle of incidence values in accordance with an aspect of the present invention.

In view of the foregoing structural and functional features described supra, methodologies in accordance with various aspects of the present invention will be better appreciated with reference to the above figures and descriptions. While, for purposes of simplicity of explanation, the methodologies of FIGS. 5 and 6 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Turning now to FIG. 5, a flow diagram illustrating a method 500 of obtaining vertical angle of incidence values in accordance with an aspect of the present invention is presented. The method 500 can be employed for a divergence detection system as part of an ion implantation system and obtains vertical angle of incidence values that are normal to a plane of a scanned ion beam or ribbon beam.

The method begins at block 502 wherein an array of beamlets are obtained from an incoming ion beam by a mask. The ion beam is traveling along a path toward the mask. The mask has an array of apertures that selectively permit portions of the incoming ion beam, referred to as beamlets to pass. The array includes one or more columns and includes a plurality of rows.

Vertical sensor locations for the array of beamlets are identified at a selected distance downstream of the mask at block 504. The vertical sensor locations are locations through which the beamlets pass after they travel the selected distance from the mask. A number of mechanisms can be employed to obtain the vertical sensor locations.

One suitable mechanism is to employ a vertically traveling sensor/profiler that continuously measures beam current as it travels vertically up and down. The vertically traveling sensor expects to measure beam current above a threshold value at expected sensor locations, which correspond to ideal and/or desired ion beam angle of incidence values. If the vertically traveling sensor measures beam current above the threshold value at a different sensor location, a vertical position offset is determined that, along with the selected distance, can be employed to determine an angle of incidence offset value.

Another suitable mechanism is to employ a multi-fingered sensor/profiler that simultaneously measures current at a number of finger locations along a vertical direction. The apertures of the mask are defined such that a small number of fingers (collectors) are able to measure current for each beamlet. By utilizing the position of the fingers that identify beam current above a threshold value, sensor positions can be determined. Subsequently, vertical angle of incidence values can be determined from the sensor positions. Additionally, the multi-fingered profiler can be movable in a horizontal direction so as to be able to obtain vertical sensor locations at multiple horizontal positions.

Continuing with the method 500, the identified vertical sensor locations are compared with expected sensor locations at block 506 to determine vertical positional offset values. Subsequently, vertical angle of incidence values for the ion beam are determined according to the vertical positional offset values and the selected distance at block 508. The vertical angle incidence values determined in block 508 are weighted in proportion to the amount of beam current measured at each nth sensor ($Flux_n$) to calculate a flux weighted average angle at block 510 defined as $Angle_{AVE}=SUM(Angle_n*Flux_n)/SUM(Flux_n)$ and to calculate the $Divergence=Angle_n(max)-Angle_n(min)$ as the maximum spread in angles. The average vertical angle is then used to alter the beam deflection and/or the tilt angle of the pedestal or module holding a target wafer to match the desired implant angle at block 512. The Divergence could be noted in implant records or used to prevent implant if it exceeded some desired limit. In the later case some adjustment of ion focus or defining apertures may be made to reduce divergence. The divergence, as calculated at block 510, is analyzed and/or compared with ranges of acceptable divergence values or limits to determine whether the divergences exceeds the acceptable limits and then adjust beam transport so that the divergence is within the acceptable limits at block 514. It is appreciated that variations of the method 500 are permitted in accordance with the present invention that also obtain horizontal angle of incidence values in order to more fully characterize the ion beam. Additionally, the present invention contemplates employing obtained beam current values to determine beam intensity and shape.

FIG. 6 is flow diagram illustrating a method 600 of obtaining vertical angle of incidence values for an incident ion beam with a multi-fingered profiler in accordance with an aspect of the present invention. The method 600 can be employed in conjunction with an ion implantation process to facilitate uniformity and correct angles of implantation.

The method 600 begins at block 602, wherein a mask having an array of apertures positioned downstream of an ion beam and a multi-fingered profiler positioned a selected distance downstream from the mask are provided. The array of apertures include a plurality of rows of apertures, lying in a horizontal/scan direction and a plurality of columns of apertures lying in a vertical direction. The multi-fingered profiler is rectangular shaped and longer in the vertical direction. The multi-fingered profiler has a number of fingers (e.g., collectors) that are able to obtain beam current measurements at a number of vertical positions. An array of beamlets are obtained from an incoming ion beam at block 604 by the mask having the array of apertures. The array of beamlets correspond to the array of apertures.

The multi-fingered profiler is moved to a horizontal position at block 606 and beam current for a column of the array of beamlets is measured. Subsequently, vertical positional offset values are determined according to location of measured beam current and expected locations at block 608. The vertical positions offset values are employed at block 610, along with a desired/ideal angle of incidence value, to determine vertical angle of incidence values corresponding to the column of the array of beamlets.

If another column of the array of beamlets remains to be measured at block 612, the multi-fingered profiler is moved to a next horizontal position at block 614 and the method 600 continues at block 606 wherein vertical angle of incidence values are obtained corresponding to remaining columns of the array. Otherwise, the method 600 ends.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. An ion implantation system comprising:
an ion beam generation mechanism that generates and directs an ion beam toward a target wafer and scans across the target wafer in a horizontal direction;
a module located downstream of the ion beam that supports the target wafer and moves the target wafer through the ion beam in a vertical direction; and
a divergence detector located downstream of the ion beam that obtains vertical angle of incidence values of the ion beam and obtains a vertical divergence profile there from, wherein the divergence detector includes a mask that selectively obtains beamlets from the ion beam, a sensor that measures beam current at a plurality of vertical locations for the beamlets, wherein the sensor is comprised of a plurality of finger sensors that obtain individual beam current measurements, and circuitry that determines centroid locations of the beamlets from individual beam current measurements and compares the centroid locations with expected locations to determine vertical angle of incidence values for the beamlets.

2. The system of claim 1, wherein the ion beam is a ribbon type beam.

3. The system of claim 1, wherein the ion beam is a pencil type beam.

4. The system of claim 1, wherein the mask includes a single column of rectangular shaped apertures that are wider in the horizontal direction than the vertical direction and the sensor travels in a vertical direction to measure beam current for beamlets defined by the rectangular shaped apertures.

5. The system of claim 1, wherein the mask includes an array of apertures and the sensor travels in a horizontal direction.

6. The system of claim 1, wherein the divergence detector further obtains horizontal angle of incidence values.

7. The system of claim 1, wherein the module adjusts its tilt axis according to the vertical divergence profile.

8. The system of claim 1, wherein the ion beam generation mechanism adjusts generation of the ion beam according to the vertical divergence profile.

9. A divergence detection system comprising:
a mask having a single column of rectangular shaped apertures that obtain rectangular shaped beamlets from an incoming ion beam;
a vertically traveling profiler positioned a selected distance downstream from the mask that measures beam current at various vertical locations, wherein the beam current measurements indicate sensor locations for the beamlets, wherein the profiler compares the indicated sensor locations with expected sensor locations to obtain vertical angle of incidence values for the beamlets of the incoming ion beam.

10. The system of claim 9, wherein the apertures of the mask have a length in a horizontal direction and a width in a vertical direction, wherein the length is greater than the width.

11. The system of claim 9, wherein the vertically traveling profiler has a length in a horizontal direction and a width in a vertical direction, wherein the length is greater than the width.

12. The system of claim 9, wherein the vertically traveling profiler determines offset values from the indicated sensor locations and the expected sensor locations and employs the offset values and the selected distance to obtain the vertical angle of incidence values.

13. A divergence detection system comprising:
a mask comprising an array of apertures that obtain an array of beamlets from an incident ion beam; and
a horizontally traveling sensor located a selected distance downstream of the mask that measures beam current at a plurality of vertical locations and obtains the plurality of measurements at a plurality of horizontal locations, wherein the sensor is longer in a vertical direction than a horizontal direction, includes a plurality of fingers that obtain the plurality of measurements, and obtains vertical angle of incidence values from the plurality of measurements, wherein the plurality of measurements indicate sensor locations and wherein the sensor compares the indicated sensor locations with expected sensor locations to obtain positional offset values, wherein the vertical angle of incidence values are a function of the positional offset values and the selected distance.

14. The system of claim 13, wherein the array of apertures comprises at least five columns and at least ten rows.

15. A method of obtaining vertical angle of incidence values comprising:
obtaining an array of beamlets from an incoming ion beam by a mask;
identifying vertical sensor locations for the array of beamlets that measure presence of beam current at a selected distance downstream of the mask;
comparing the identified vertical sensor locations with expected sensor locations to determine vertical positional offset values; and
determining vertical angle of incidence values for the ion beam according to the vertical positional offset values and the selected distance.

16. The method of claim 15, further comprising compiling a vertical profile from the vertical angle of incidence values.

17. The method of claim 15, wherein the array comprises a single column of rectangular shaped beamlets.

18. The method of claim 15, wherein the array comprises a plurality of columns of circular shaped beamlets.

19. The method of claim 15, wherein identifying vertical sensor locations comprises measuring beam current at various vertical locations and identify vertical sensor locations where beam current above a threshold value is measured.

20. The method of claim 15, further comprising determining an average angle flux according to the identified vertical sensor locations.

21. The method of claim 15, further comprising determining a vertical divergence value according to the vertical angle of incidence values and adjusting beam transport and/or tilt angle on the vertical divergence value exceeding a range of acceptable divergence limits.

22. The system of claim 1, wherein the circuitry further determines a flux weighted average of the vertical angle of incidence values.

23. The system of claim 1, wherein the plurality of finger sensors obtain at least five beam current measurements per beamlet.

24. The system of claim 1, wherein the mask includes a single column of oval shaped apertures that are wider in the horizontal direction than the vertical direction and the sensor travels in a vertical direction to measure beam current for beamlets defined by the rectangular shaped apertures.

25. The divergence detection system of claim 9, further comprising a horizontally traveling profiler positioned a selected distance downstream from the mask that measures beam current at various horizontal locations to obtain horizontal angle of incidence values for the beamlets of the incoming ion beam.

* * * * *